(12) United States Patent
Mihara et al.

(10) Patent No.: US 10,622,540 B2
(45) Date of Patent: Apr. 14, 2020

(54) PIEZOELECTRIC FUNCTIONAL FILM, ACTUATOR, AND INK-JET HEAD

(71) Applicant: Panasonic Intellectual Property Management Co., Ltd., Osaka (JP)

(72) Inventors: Kensuke Mihara, Osaka (JP); Takakiyo Harigai, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/338,912

(22) PCT Filed: Dec. 11, 2017

(86) PCT No.: PCT/JP2017/044300
§ 371 (c)(1),
(2) Date: Apr. 2, 2019

(87) PCT Pub. No.: WO2018/110483
PCT Pub. Date: Jun. 21, 2018

(65) Prior Publication Data
US 2020/0052188 A1    Feb. 13, 2020

(30) Foreign Application Priority Data
Dec. 12, 2016 (JP) .................. 2016-239983

(51) Int. Cl.
*H01L 41/08* (2006.01)
*B41J 2/14* (2006.01)
*H01L 41/187* (2006.01)
*H01L 41/09* (2006.01)

(52) U.S. Cl.
CPC ...... *H01L 41/0815* (2013.01); *B41J 2/14233* (2013.01); *H01L 41/0973* (2013.01); *H01L 41/1876* (2013.01)

(58) Field of Classification Search
CPC ............. H01L 41/0815; H01L 41/0973; H01L 41/1876; B41J 2/14233
See application file for complete search history.

(56) References Cited

U.S. PATENT DOCUMENTS

| | | |
|---|---|---|
| 2008/0079783 A1 | 4/2008 | Fujii |
| 2008/0081128 A1 | 4/2008 | Fujii |
| 2008/0081216 A1 | 4/2008 | Fujii et al. |

(Continued)

FOREIGN PATENT DOCUMENTS

| | | |
|---|---|---|
| JP | 4142705 B | 9/2008 |
| JP | 4142706 B | 9/2008 |

(Continued)

OTHER PUBLICATIONS

IP.com search (Year: 2020).*

(Continued)

*Primary Examiner* — Lisa Solomon
(74) *Attorney, Agent, or Firm* — McDermott Will & Emery LLP

(57) ABSTRACT

A piezoelectric functional film includes a base layer and a piezoelectric layer. The piezoelectric layer contains niobium-doped lead zirconate titanate. The base layer contains one of niobium-doped lead titanate, (niobium, lanthanum)-doped lead titanate, and (niobium, lanthanum, magnesium)-doped lead titanate.

5 Claims, 6 Drawing Sheets

(56) References Cited

U.S. PATENT DOCUMENTS

| | | |
|---|---|---|
| 2008/0231667 A1 | 9/2008 | Arakawa et al. |
| 2009/0114875 A1 | 5/2009 | Arakawa |
| 2014/0240405 A1* | 8/2014 | Furuya ................ H01L 41/0973 347/71 |

FOREIGN PATENT DOCUMENTS

| | | |
|---|---|---|
| JP | 4246227 B | 4/2009 |
| JP | 4452752 B | 4/2010 |
| JP | 4505492 B | 7/2010 |
| JP | 5367242 B | 12/2013 |

OTHER PUBLICATIONS

International Search Report of PCT application No. PCT/JP2017/044300 dated Feb. 27, 2018.
R.Ramesh, Appl.Phys.Lett.(1993) vol. 63, No. 1, p. 27-29.

* cited by examiner

PIEZOELECTRIC FUNCTIONAL FILM, ACTUATOR, AND INK-JET HEAD

CROSS-REFERENCE TO RELATED APPLICATIONS

This application is a U.S. national stage application of the PCT international application No. PCT/JP2017/044300 filed on Dec. 11, 2017, which claims the benefit of foreign priority of Japanese patent application No. 2016-239983 filed on Dec. 12, 2016, the contents all of which are incorporated herein by reference.

TECHNICAL FIELD

The present disclosure relates to a piezoelectric functional film including a piezoelectric layer containing niobium-doped lead zirconate titanate, an actuator, and an inkjet head.

BACKGROUND ART

Demands for printing on packages, textiles, and product decorations have been escalating. Inkjet printing is more advantageous than engraved-block printing in that it is capable of handling small lot production and achieving shorter lead time. For this reason, the inkjet printing has been considered as a printing technique for packages, textiles, and product decorations.

An inkjet printing machine is furnished with an actuator for ejecting ink. The actuator employs, as a drive means, a piezoelectric element in which electrodes are disposed on both major surfaces of a piezoelectric film mainly containing lead zirconate titanate.

Printing objects, such as packages, textiles, and product decorations have a less flat printing surface than printing objects, such as printing paper. Moreover, for printing objects, such as packages, textiles, and product decorations, more varieties of inks are required than for printing objects such as printing paper.

For this reason, the piezoelectric element requires higher piezoelectric performance so that the printing objects with non-flat printing surfaces can be printed at high speed and high resolution using various types of inks. A conventional technique for increasing the piezoelectric constant of lead zirconate titanate is the technique in which the piezoelectric film is made to have (001) preferential orientation and also lead zirconate titanate is doped with niobium in an amount of 10 mole % to 40 mole %.

PTLs 1 to 6 disclose conventional techniques in the above-described field.

CITATION LIST

Patent Literature

PTL 1: Japanese Patent No. 4,142,705
PTL 2: Japanese Patent No. 4,142,706
PTL 3: Japanese Patent No. 4,246,227
PTL 4: Japanese Patent No. 5,367,242
PTL 5: Japanese Patent No. 4,505,492
PTL 6: Japanese Patent No. 4,452,752

Non-Patent Literature

NPL 1: R. Ramesh, Appl. Phys. Lett. (1993) Vol. 63, No. 1, pp. 27-29

SUMMARY

A drawback of doping lead zirconate titanate with niobium is that an internal electric field occurs in the piezoelectric element.

A driver is often used in the form of an actuator in which a substrate, a lower electrode, a piezoelectric film, and an upper electrode are stacked on one another. In the case that the piezoelectric layer of this actuator is made of niobium-doped lead zirconate titanate, an internal electric field is produced in a direction from the lower electrode toward the upper electrode. For example, the value of the internal electric field that is read from the polarization-electric field curve (P-E curve) disclosed in FIG. 7 of PTL 4 is 18 kV/cm.

NPL 1 describes that a sample having an internal electric field of 10-15 kV/cm causes polarization deterioration under a continuous operation earlier than a sample having no internal electric field. In a piezoelectric film, such as piezoelectric film made of lead zirconate titanate, exhibiting ferroelectricity, the polarization correlates to the piezoelectric performance. Therefore, it is expected that an actuator including a piezoelectric film made of niobium-doped lead zirconate titanate causes deterioration of the piezoelectric performance of the piezoelectric film at an earlier stage when operated continuously.

On the other hand, PTL 4 and PTL 5 disclose a technique of reducing the internal electric field of the piezoelectric film by substituting lead ions with bismuth ions. However, this technique requires larger amounts of additives to the piezoelectric film, and necessitates more complicated controlling of the composition of the piezoelectric film. For this reason, this technique is undesirable from the viewpoint of mass production.

In addition, PTL 6 discloses a piezoelectric film in which the mole ratio of lead with respect to that of the cations other than lead is set to equal to or less than 1.03. However, this causes degradation of ferroelectricity at the same time and is, therefore, undesirable.

A piezoelectric functional film according to the present disclosure includes a base layer and a piezoelectric layer. The piezoelectric layer is made of, i.e., contains niobium-doped lead zirconate titanate. The base layer is made of, i.e., contains one of niobium-doped lead titanate, (niobium, lanthanum)-doped lead titanate, and (niobium, lanthanum, magnesium)-doped lead titanate.

An actuator according to an aspect of the present disclosure includes a substrate, a lower electrode disposed on the substrate, a piezoelectric functional film disposed on the lower electrode, and an upper electrode disposed on the piezoelectric functional film. The piezoelectric film piezoelectric functional film includes a base layer and a piezoelectric layer provided on the base layer. The piezoelectric layer is made of, i.e., contains niobium-doped lead zirconate titanate. The base layer is made of, i.e., contains one of niobium-doped lead titanate, (niobium, lanthanum)-doped lead titanate, and (niobium, lanthanum, magnesium)-doped lead titanate.

An inkjet head according to an aspect of the present disclosure includes a flow passage, a pressure chamber connected with the flow passage, and a nozzle connected with the pressure chamber. The pressure chamber includes an actuator that controls a pressure inside the pressure chamber. The actuator includes a substrate, a lower electrode disposed on the substrate, a piezoelectric functional film disposed on the lower electrode, and an upper electrode disposed on the piezoelectric functional film. The piezoelectric functional film includes a base layer, and a piezoelectric layer provided on the base layer. The piezoelectric layer is made of, i.e., contains niobium-doped lead zirconate titanate. The base layer is made of, i.e., contains one of niobium-doped lead titanate, (niobium, lanthanum)-doped lead titanate, and (niobium, lanthanum, magnesium)-doped lead titanate.

These configurations reduce internal electric field of the piezoelectric element that results from the niobium-doped lead zirconate titanate.

DETAIL DESCRIPTION OF PREFERRED EMBODIMENT

Figure 1:
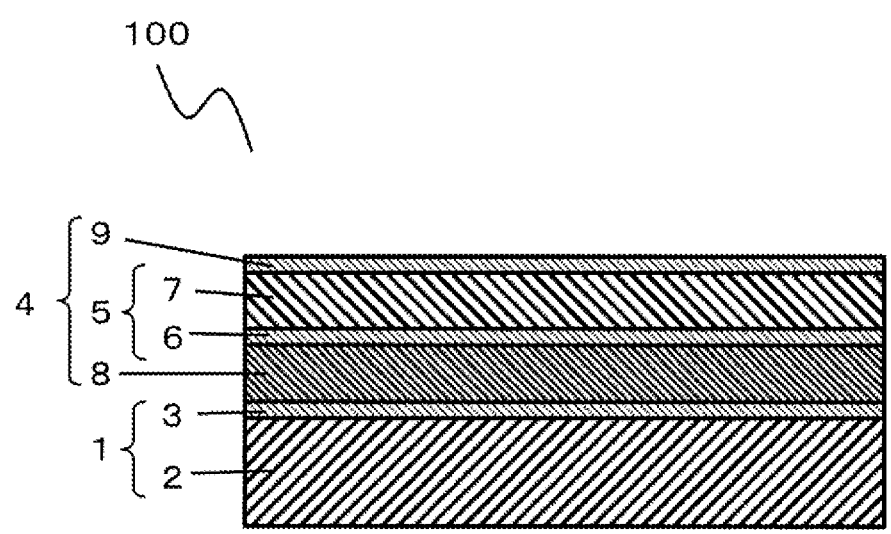
FIG. 1 is a cross-sectional view of an actuator including a piezoelectric functional film according to an exemplary embodiment of the present disclosure.

An actuator including a piezoelectric functional film according to an exemplary embodiment of the present disclosure will be described below with reference to the drawings. Note that each of the exemplary embodiments described below illustrates a specific example of the present disclosure. Accordingly, the shapes, structural elements, arrangements and connections of the structural elements, etc. shown in the following exemplary embodiments are merely examples, and therefore do not limit the scope of the present disclosure. Therefore, among the constituent elements in the following exemplary embodiments, those not recited in any one of the independent claims which indicate the broadest inventive concepts of the present invention are described as optional elements.

In addition, the drawings are schematic and do not necessarily depict the elements exactly. In the drawings, substantially the same parts are designated by the same reference numerals, and the repetitive description thereof may be omitted or simplified.

A piezoelectric functional film according to an exemplary embodiment of the present disclosure will be described below with reference to the drawings. FIG. 1 is a cross-sectional view of actuator 100 including piezoelectric functional film 5. In actuator 100, piezoelectric element 4 is disposed on diaphragm 1. Piezoelectric element 4 includes lower electrode 8, piezoelectric functional film 5, and upper electrode 9 which are stacked in that order. Lower electrode 8 is disposed on diaphragm 1.

Diaphragm 1 may have a two-layer substrate including silicon substrate 2 and insulation film 3 on silicon substrate 2. Insulation film 3 is made of silicon dioxide. Piezoelectric functional film 5 includes base layer 6 disposed on lower electrode 8, and piezoelectric layer 7 disposed on base layer 6. Base layer 6 may be made of one of lead titanate doped with niobium (also referred to as niobium-doped lead titanate or Nb-doped PT), lead titanate doped with niobium and lanthanum (also referred to as (niobium, lead titanate)-doped lead titanate or Nb-doped PLT), and lead titanate doped with niobium, lanthanum, and magnesium (also referred to as (niobium, lanthanum, magnesium)-doped lead titanate or Nb-doped PLMT). Piezoelectric layer 7 has (001) preferential orientation, and it may be made of lead zirconate titanate doped with niobium (also referred to as Nb-doped PZT). Lower electrode 8 is disposed between diaphragm 1 and base layer 6. Lower electrode 8 is made of metal, such as platinum or iridium. Upper electrode 9 is disposed on piezoelectric functional film 5. Upper electrode 9 is made of metal, such as platinum or gold.

Actuator 100 may cause diaphragm 1 to vibrate by applying a control voltage between upper electrode 9 and lower electrode 8. The control voltage applied between upper electrode 9 and lower electrode 8 causes vibration in a direction along the thickness of piezoelectric layer 7 (i.e., in a vertical direction in the figure) due to the reverse piezoelectric effect of piezoelectric layer 7.

Piezoelectric layer 7 made of Nb-doped PZT and base layer 6 made of one of Nb-doped PT, Nb-doped PLT, and Nb-doped PLMT reduce the internal electric field of piezoelectric functional film 5. Since the internal electric field of the piezoelectric functional film 5 is reduced, the piezoelectric performance of actuator 100 is prevented from deterioration when operated continuously.

The doping proportion of niobium in the Nb-doped PZT forming piezoelectric layer 7 is equal to or greater than 10 mole % and is equal to or smaller than 40 mole %. This composition enhances the performance of the piezoelectric material efficiently. The doping proportion of the niobium means the ratio of the number of moles of niobium to the total of the number of moles of zirconium, the number of moles of titanium, and the number of moles of niobium in piezoelectric layer 7 made of Nb-doped PZT.

In the case that piezoelectric functional film 5 is used as a driver in actuator 100, the drive voltage applied to piezoelectric functional film 5 is high, and accordingly, the advantageous effects obtained by reducing the internal electric field are significant. In the case that actuator 100 is used as an ink ejecting device of an inkjet head, the advantageous effects resulting from the reduction of the internal electric field can be obtained more significantly.

Figure 2:
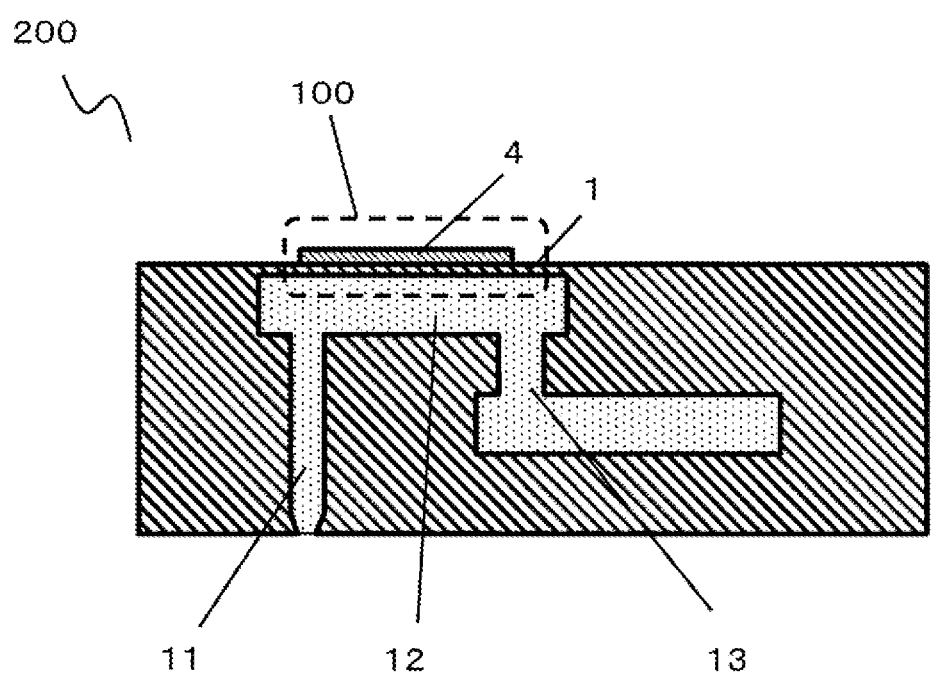
FIG. 2 is a cross-sectional view of an inkjet head including the actuator according to the embodiment.

Advantageous effects of actuator 100 of the present disclosure for an inkjet head will be described. FIG. 2 shows a structure of inkjet head 200. Inkjet head 200 includes nozzle 11 that ejects ink, pressure chamber 12 that controls the pressure at which the ink is ejected, and flow passage 13 that introduces the ink into pressure chamber 12. Pressure chamber 12 includes actuator 100 of the present disclosure. In actuator 100, diaphragm 1 functions as a ceiling portion of pressure chamber 12. Actuator 100 includes piezoelectric element 4 disposed on diaphragm 1. When a drive signal is applied to actuator 100, diaphragm 1 has a shape changed, and accordingly, applies an ejection pressure to the ink inside pressure chamber 12, thereby ejecting the ink through nozzle 11. Thus, actuator 100 applies the ejection pressure to the ink, which is highly viscous, so that actuator 100 may requires high piezoelectric performance. Therefore, advantageous effects which result from the reduction of the internal electric field and which are obtained by the present disclosure are exhibited more significantly.

Examples of the exemplary embodiment of the present disclosure and a comparative example compared to the embodiment will be described below. Each of the examples and the comparative example is shown as actuator 100 including piezoelectric element 4 including lower electrode 8, piezoelectric functional film 5, and upper electrode 9. The internal electric field is determined from P-E curves of piezoelectric element 4 shown in FIGS. 3 to 6. In Examples 1 to 3, piezoelectric layer 7 is made of Nb-doped PZT, base layer 6 is made of Nb-doped PLMT, and the doping proportions of niobium are different. In Comparative Example 1, piezoelectric layer 7 is made of Nb-doped PZT, but base layer 6 is made of lead titanate doped with lanthanum and magnesium (PLMT). PLMT of the base layer is not doped with niobium.

The criterion for determining the advantageous effect is that the internal electric field of the piezoelectric element is equal to or less than 10 kV/cm.

Example 1

The structure of actuator 100 of Example 1 will be described. Diaphragm 1 has a two-layer substrate in which insulation film 3 made of silicon dioxide is disposed on silicon substrate 2. The thickness of silicon substrate 2 is 525 μm, and the thickness of insulation film 3 is 70 nm. Lower electrode 8 is made of platinum, and has a thickness of 0.4 μm. Piezoelectric functional film 5 includes base layer 6 made of Nb-doped PLMT and piezoelectric layer 7 composed made Nb-doped PZT. The thickness of base layer 6 is 60 nm. The thickness of piezoelectric layer 7 is 3.5 μm. Upper electrode 9 is made of gold, and has a thickness of 0.3 μm.

Lower electrode 8 is formed on insulation film 3 by sputtering.

Base layer 6 is formed on lower electrode 8 by sputtering. The doping proportion of niobium in base layer 6 made of Nb-doped PLMT is 8 mole %. The doping proportion of niobium herein means the ratio of the number of moles of niobium with respect to the total of the number of moles of titanium and the number of moles of niobium in base layer 6 made of Nb-doped PLMT. The composition of the Nb-doped PLMT layer may be confirmed by, e.g. X-ray photoelectron spectroscopy (XPS) or energy-dispersive X-ray spectroscopy (SEM-EDX).

Piezoelectric layer 7 is formed on base layer 6 by sputtering. The doping proportion of niobium in the Nb-doped PZT is 10 mole %. The composition of piezoelectric layer 7 made of the Nb-doped PZT may be confirmed by, e.g. X-ray photoelectron spectroscopy (XPS) or energy-dispersive X-ray spectroscopy (SEM-EDX).

Figure 3:
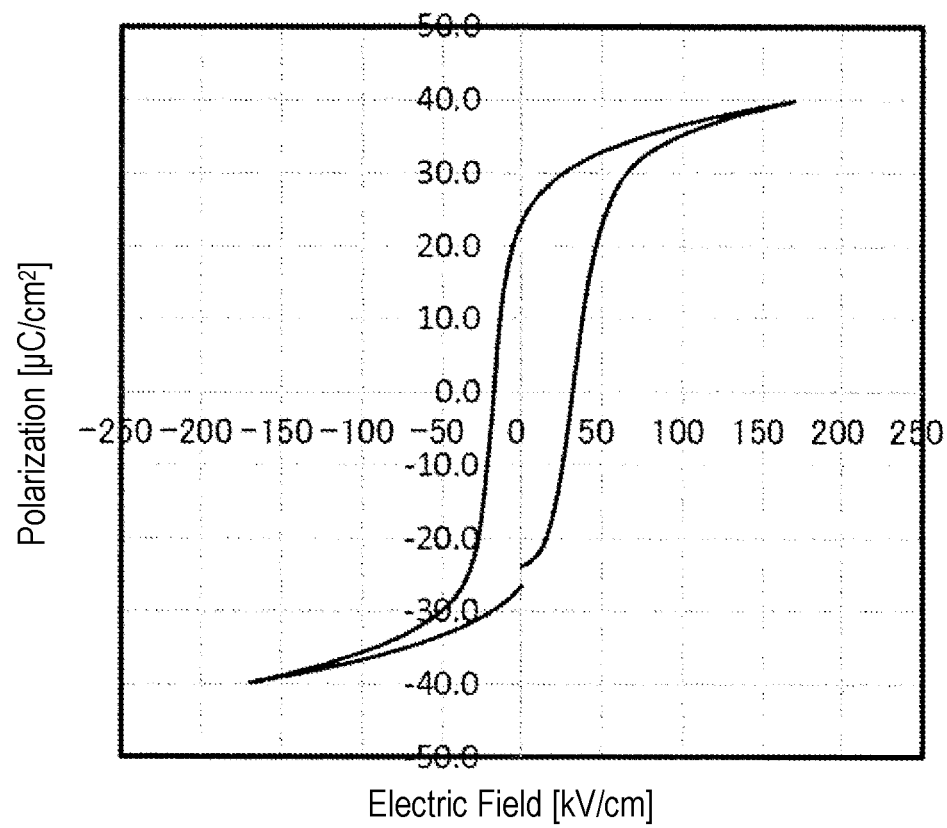
FIG. 3 shows a PE curve of the piezoelectric element of Example 1.

FIG. 3 shows a P-E curve of piezoelectric element 4 of Example 1. The internal electric field is 7.2 kV/cm. The internal electric field is a value obtained from the P-E curve by dividing the sum of coercive electric field Ec1 on the low electric field side and coercive electric field Ec2 on the high electric field side by 2.

Example 2

Actuator 100 of Example 2 will be described. Actuator 100 of Example 2 is different from actuator 100 of Example 1 in that base layer 6 is made of Nb-doped PLMT in which the doping proportion of niobium is 12% and piezoelectric layer 7 is made of Nb-doped PZT in which the doping proportion of niobium is 15%. The rest of the conditions are the same as actuator 100 of Example 1.

The structure of actuator 100 of Example 2 will be described. Diaphragm 1 has a two-layer substrate in which insulation film 3 made of silicon dioxide layer is disposed on silicon substrate 2. The thickness of silicon substrate 2 is 525 μm, and the thickness of insulation film 3 is 70 nm. Lower electrode 8 is made of platinum, and has a thickness of 0.4 μm. Piezoelectric functional film 5 includes base layer 6 made of PLMT and piezoelectric layer 7 made of Nb-doped PZT. The thickness of base layer 6 is 60 nm. The thickness of piezoelectric layer 7 is 3.5 μm. Upper electrode 9 is made of gold, and has a thickness of 0.3 μm.

Lower electrode 8 is formed on insulation film 3 by sputtering. The doping proportion of niobium in the Nb-doped PLMT is 12 mole %.

Piezoelectric layer 7 is formed on base layer 6 by sputtering. The doping proportion of niobium in the Nb-doped PZT is 15 mole %.

Figure 4:
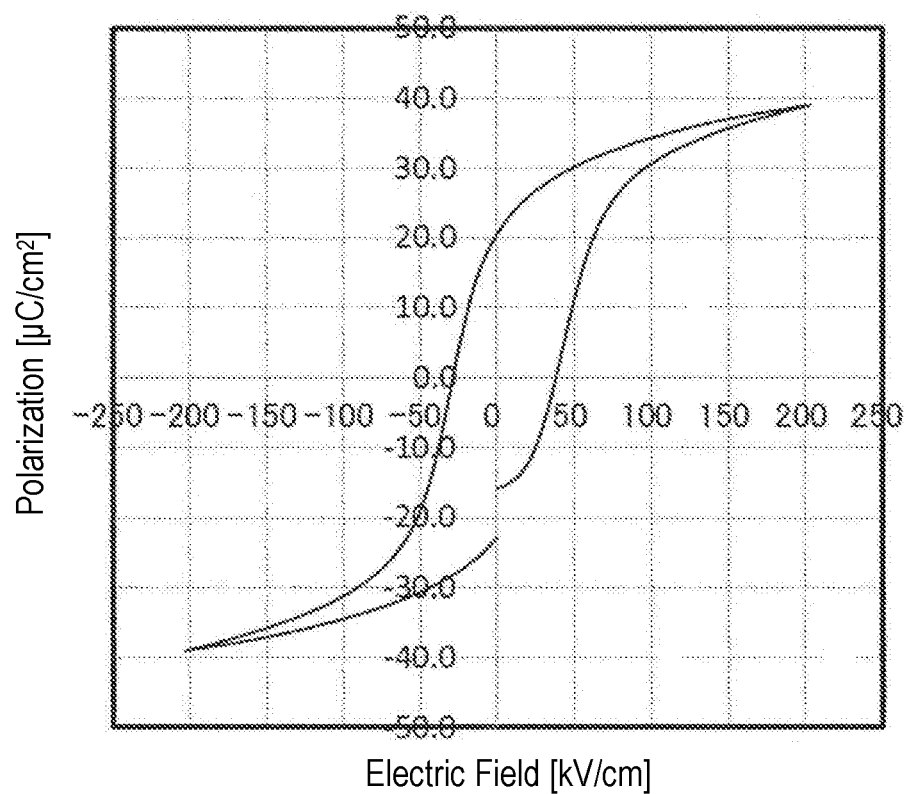
FIG. 4 shows a PE curve of the piezoelectric element of Example 2.

FIG. 4 shows a P-E curve of piezoelectric element 4 of Example 2. The internal electric field is 4.7 kV/cm.

Example 3

Actuator 100 of Example 3 will be described. Actuator 100 of Example 3 is different from actuator 100 of Example 1 in that base layer 6 is made of Nb-doped PLMT in which the doping proportion of niobium is 16% and piezoelectric layer 7 is made of Nb-doped PZT in which the doping proportion of niobium is 20%. The rest of the conditions are the same as actuator 100 of Example 1.

The structure of actuator 100 of Example 3 will be described. Diaphragm 1 has a two-layer substrate in which insulation film 3 made of silicon dioxide layer is disposed on silicon substrate 2. The thickness of silicon substrate 2 is 525 μm, and the thickness of insulation film 3 is 70 nm. Lower electrode 8 is made of platinum, and has a thickness of 0.4 μm. Piezoelectric functional film 5 includes base layer 6 made of PLMT and piezoelectric layer 7 made of Nb-doped PZT. The thickness of base layer 6 is 60 nm. The thickness of piezoelectric layer 7 is 3.5 μm. Upper electrode 9 is made of gold, and has a thickness of 0.3 μm.

Lower electrode 8 is formed on insulation film 3 by sputtering. The doping proportion of niobium in the Nb-doped PLMT is 16 mole %.

Piezoelectric layer 7 is formed on base layer 6 by sputtering. The doping proportion of niobium in the Nb-doped PZT is 20 mole %.

Figure 5:
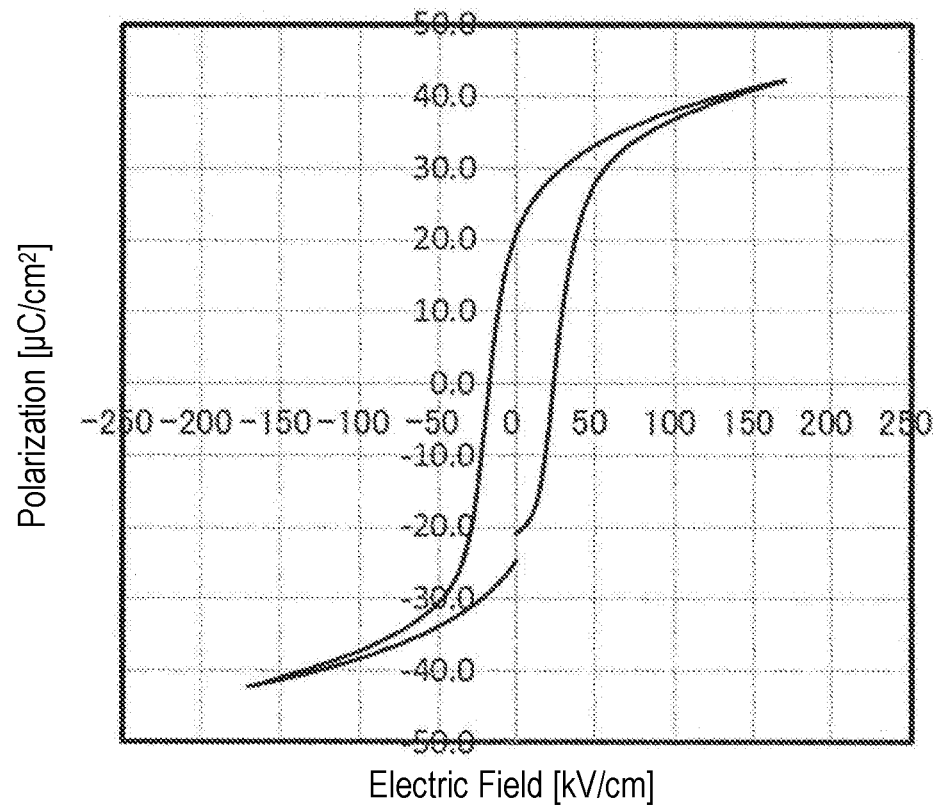
FIG. 5 shows a PE curve of the piezoelectric element of Example 3.

FIG. 5 shows a P-E curve of piezoelectric element 4 of Example 3. The internal electric field is 3.1 kV/cm.

Comparative Example 1

Actuator 100 of Comparative Example 1 will be described. Actuator 100 of Comparative Example 1 is different from actuator 100 of Example 1 in that base layer 6 is made of PLMT that is not doped with niobium. The rest of the conditions are the same as actuator 100 of Example 1.

The structure of actuator 100 of Comparative Example 1 will be described. Diaphragm 1 has a two-layer substrate in which insulation film 3 made of silicon dioxide layer is disposed on silicon substrate 2. The thickness of silicon substrate 2 is 525 μm, and the thickness of insulation film 3 is 70 nm. Lower electrode 8 is made of platinum, and the thickness thereof is 0.4 μm. Piezoelectric functional film 5 includes base layer 6 made of PLMT and piezoelectric layer 7 made of Nb-doped PZT. The thickness of base layer 6 is 60 nm. The thickness of piezoelectric layer 7 is 3.5 μm. Upper electrode 9 is made of gold, and has a thickness of 0.3 μm.

Lower electrode 8 is formed on insulation film 3 by sputtering.

Piezoelectric layer 7 is formed on base layer 6 by sputtering. The doping proportion of niobium in Nb-doped PZT is 10 mole %.

Figure 6:
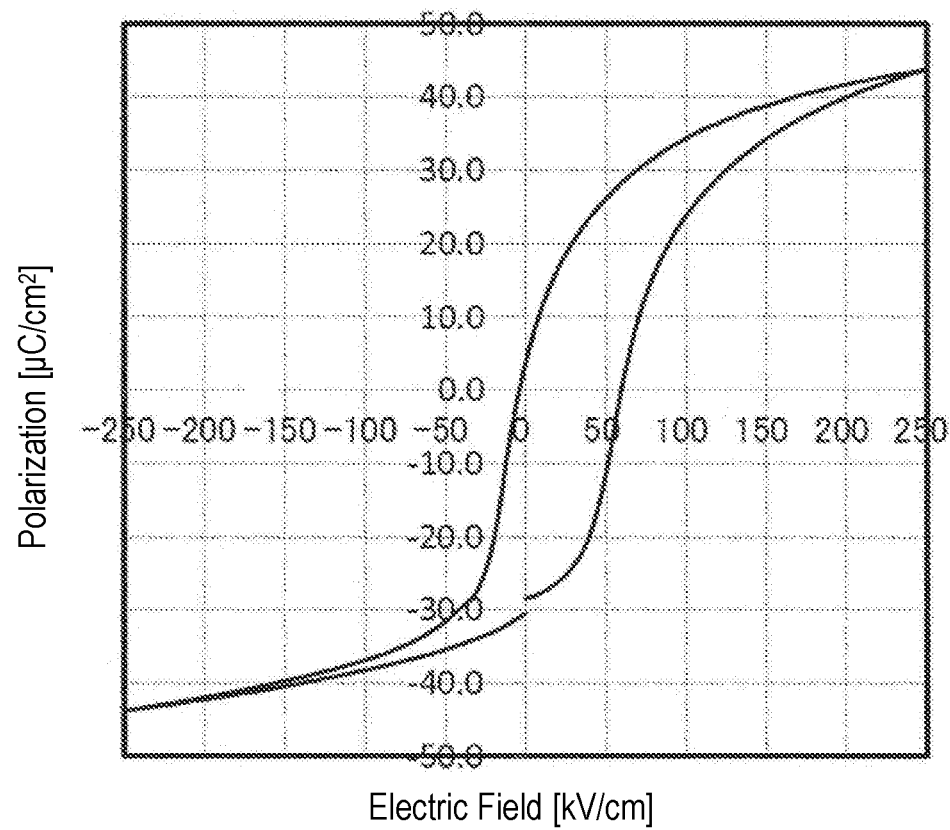
FIG. 6 shows a PE curve of the piezoelectric element of Comparative Example 1.

FIG. 6 shows a P-E curve of piezoelectric element 4 of Comparative Example 1. The internal electric field is 27.8 kV/cm.

As described above, the results of Examples 1 to 3 and Comparative Example 1 also demonstrate that Nb-doped PLMT employed as Nb-doped PZT of base layer 6 reduces the internal electric field of piezoelectric element 4.

While the foregoing exemplary embodiment describe that base layer 6 of piezoelectric layer 7 made of Nb-doped PZT is made of Nb-doped PLMT, the present invention is not limited to these exemplary embodiment. The Nb-doped PLMT in Example 1 is a component that is intended to improve the crystallinity of piezoelectric layer 7. Therefore, the base lay may mainly contain lead titanate, which is crystallized more easily than lead zirconate and which is a component of piezoelectric layer 7. In other words, the same advantageous effects are obtained by the above-described Nb-doped PLMT when base layer 6 of the present disclosure is made of Nb-doped PLT or Nb-doped PT that mainly contains lead titanate.

While diaphragm 1 has a two-layer structure including silicon substrate 2 and insulation film 3 made of silicon dioxide layer, diaphragm 1 may have a single-layer structure of a silicon dioxide layer.

In addition, while it has been described that the doping proportion of niobium in piezoelectric layer 7 is 10 mole %, high piezoelectric performance may be obtained by the doping proportion of niobium is equal to or larger than 10 mole % and is equal to or smaller than 40 mole %. However, the doping proportion of niobium in piezoelectric layer 7 equal to or greater than or 25 mole % tends to suppress the internal electric field. Therefore, in the case that base layer 6 is doped with niobium, the doping proportion of niobium in piezoelectric layer 7 is equal to or larger than 10 mole % and is equal to or smaller than 25 mole %, being especially advantageous.

The actuators of Examples thus improve the hysteresis of niobium-doped lead zirconate titanate.

The doping proportion of niobium in base layer 6 preferably is equal to or larger than 8 mole % and is equal to or larger than 16 mole %. The doping proportion of niobium less than 8 mole % provides excessively large internal electric field. The doping proportion of niobium larger than 16 mole % may not provide piezoelectric layer 7 with (001)/(100) preferential orientation. The doping proportion of niobium in base layer 6 indicates the ration of the number of moles of niobium accounts to the total of the number of moles of titanium and the number of moles of niobium in base layer 6. In base layer 6 of Example 1 (Nb-doped PT), the doping proportion of niobium indicates the ration of the number of moles of niobium to the total of the number of moles of titanium and the number of moles of niobium in the Nb-doped PT. In base layer 6 of Example 2 (Nb-doped PLT), the doping proportion of niobium indicates the ration of the number of moles of niobium accounts to the total of the number of moles of titanium and the number of moles of niobium in the Nb-doped PLT. In base layer 6 of Example 3 (Nb-doped PLMT), the doping proportion of niobium indicates the ratio of the number of moles of niobium accounts to the total of the number of moles of titanium and the number of moles of niobium in the Nb-doped PLMT.

INDUSTRIAL APPLICABILITY

A piezoelectric functional film according to the present disclosure is useful especially for inkjet head applications that require high drive voltages.

REFERENCE MARKS IN THE DRAWINGS 1 diaphragm
5 piezoelectric functional film
6 base layer
7 piezoelectric layer
8 lower electrode
9 upper electrode
11 nozzle
12 pressure chamber
13 flow passage
100 actuator
200 inkjet head

The invention claimed is:

1. A piezoelectric functional film comprising:
a base layer, and
a piezoelectric layer provided on the base layer,
wherein the piezoelectric layer contains niobium-doped lead zirconate titanate, and
wherein the base layer contains one of niobium-doped lead titanate, (niobium, lanthanum)-doped lead titanate, and (niobium, lanthanum, magnesium)-doped lead titanate.

2. The piezoelectric functional film of claim 1, wherein, in the base layer, a ratio of the number of moles of the niobium to a total of the number of moles of titanium and the number of moles of the niobium is equal to or greater than 8 mole % and equal to or less than 16 mole %.

3. The piezoelectric functional film of claim 1, wherein, in the piezoelectric layer, a ratio of the number of moles of niobium to a total of the number of moles of titanium, the number of moles of zircon, and the number of moles of niobium is equal to or greater than 10 mole % and is equal to or less than to 40 mole %.

4. An actuator comprising:
a diaphragm;
a lower electrode disposed on the diaphragm;
a piezoelectric functional film disposed on the lower electrode; and
an upper electrode disposed on the piezoelectric functional film,
wherein the piezoelectric functional film includes a base layer and a piezoelectric layer provided on the base layer,
wherein the piezoelectric layer contains niobium-doped lead zirconate titanate, and
wherein the base layer contains one of niobium-doped lead titanate, (niobium, lanthanum)-doped lead titanate, and (niobium, lanthanum, magnesium)-doped lead titanate.

5. An inkjet head comprising:
a flow passage;
a pressure chamber connected with the flow passage; and
a nozzle connected with the pressure chamber,
wherein the pressure chamber includes an actuator that controls a pressure inside the pressure chamber,
wherein the actuator includes:
a diaphragm;
a lower electrode disposed on the diaphragm;
a piezoelectric functional film disposed on the lower electrode; and
an upper electrode disposed on the piezoelectric functional film,
wherein the piezoelectric functional film includes a base layer and a piezoelectric layer provided on the base layer, wherein the piezoelectric layer contains niobium-doped lead zirconate titanate, and wherein the base layer contains one of niobium-doped lead titanate, (niobium, lanthanum)-doped lead titanate, and (niobium, lanthanum, magnesium)-doped lead titanate.

* * * * *